United States Patent [19]

Kisters

[11] 4,438,560
[45] Mar. 27, 1984

[54] METHOD FOR PRODUCING MULTIPLANE CIRCUIT BOARDS

[75] Inventor: Günter Kisters, Issum, Fed. Rep. of Germany

[73] Assignee: Kollmorgen Technologies Corporation, Dallas, Tex.

[21] Appl. No.: 267,654

[22] Filed: May 27, 1981

[30] Foreign Application Priority Data

May 28, 1980 [DE] Fed. Rep. of Germany ....... 3020196

[51] Int. Cl.³ ............................................. H05K 3/36
[52] U.S. Cl. ........................................ 29/830; 29/846; 29/847; 174/68.5; 361/414
[58] Field of Search ................. 29/738, 739, 844, 845, 29/846, 847, 848, 849, 830, 837, 853; 174/68.5; 361/414

[56] References Cited

U.S. PATENT DOCUMENTS

| | | | |
|---|---|---|---|
| 3,493,671 | 2/1970 | Horwitz et al. | 174/68.5 |
| 3,509,268 | 4/1970 | Schwartz et al. | 361/414 |
| 3,522,474 | 8/1970 | Piel | 361/414 |
| 3,867,759 | 2/1975 | Siefker | 361/414 |
| 4,150,421 | 4/1979 | Nishihara et al. | 361/414 |

FOREIGN PATENT DOCUMENTS 644051 1/1979 U.S.S.R. .............................. 361/414

Primary Examiner—Carl E. Hall
Assistant Examiner—P. W. Echols
Attorney, Agent, or Firm—Morgan, Finnegan, Pine, Foley & Lee

[57] ABSTRACT

A method for producing multiplane circuit boards in which a plurality of planar members, each having a plurality of connecting areas disposed in rows on the planar member, each connecting area having interlinking positions and interrupting positions, with such positions in predetermined locations, are prepared. A plurality of planar members, each having trains of conductors in parallel paths at predetermined locations are also prepared. Such planar members are then stacked, one on the other, with the connecting areas and conducting paths in predetermined position and the stacked planar members are then laminated together. Selected of the interlinking positions and selected of the interrupting positions are then interconnected by drilling the laminate to form the multiplane circuit board.

10 Claims, 14 Drawing Figures

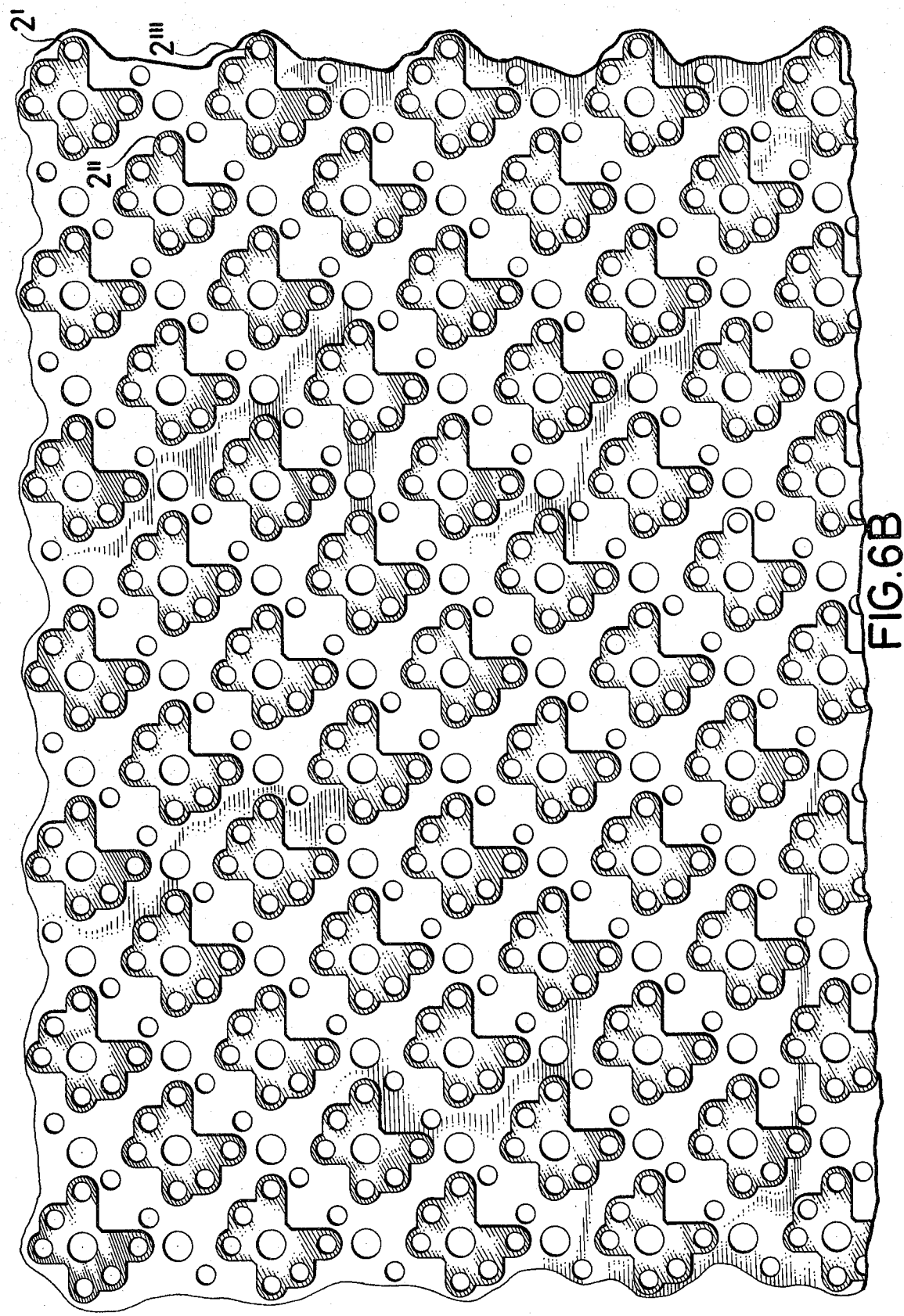

METHOD FOR PRODUCING MULTIPLANE CIRCUIT BOARDS

The present invention relates to a method of producing multiplane circuits of the type of printed circuit boards.

Multiplane circuit boards with trains or tracks of conductors on two or a plurality of planes are a component generally used in electronic applications. According to the state of the art, the production of such circuit boards requires, to begin with, the preparation of drawings or diagrams on the basis of the circuit documentation prepared by the manufacturer of the equipment. Said drawings or diagrams show the course of the conductor trains or tracks, thus the pattern of the tracks of the individual planes of conductor tracks. Based on said documentation the pattern of conductor tracks is subsequently copied onto the carrier material, normally by screen or photo printing, in order to subsequently structure the conductor tracks in the known manner, for example, by application of the conventional processing steps comprising electrodepositing and etching. It has been proposed also to produce the conductor tracks by the so-called additive-method.

If the circuit boards involved have more than two planes the individual patterns of conductor trains are first produced on carrier foils, hereinafter also called "prepregs", which are suitably dimensioned with respect to thickness. The individual layers are subsequently combined by hot press-molding to form one unit. Subsequently, bore holes are drilled at those points specified for interconnecting the conductor tracks of the different planes and/or for the connection with external components. The walls of said bore holes are provided in the known manner with a metal coating. Such borings disposed in accordance with the insertion diagram serve also the purpose of connecting the connection leads of components; the bore holes are hereinafter generally referred to as "insertion bores".

The production of multiplane circuit boards with the application of known methods is thus a relatively highly complicated operation. It is necessary in such a production, to begin with, to prepare drawings or diagrams for each of the individual planes of conductor tracks based on the electrical circuit diagram, taking into consideration the diagram of component insertions. This "breakdown" operation involves extremely time-consuming preliminary work even with the use of modern computers and programs developed for applications of this type. In spite of the use of these so-called computer-assisted design concepts it is necessary, as a rule, to accommodate a number of conductor tracks on the individual planes by hand in order to avoid an excessively high number of conductor planes.

Based on said diagrams the conductor track patterns are first applied to copper-clad carrier foils, mostly by photo printing, i.e., to so-called "prepregs", and the conductor tracks are then formed normally by etching. The individual layers composed of such prepregs and conductor tracks applied thereto are subsequently stacked to form a package with the help of registering devices and then molded under pressure to form one uniform multiplane circuit board. The insertion bores and connecting bore holes are prepared subsequently, which bore holes serve the purpose of interconnecting the conductor tracks disposed on different planes and to connect said tracks to external components, with the electrical and mechanical connection being achieved by metallizing the walls of the holes.

The "break-down" work and, in particular with multiplane circuit boards the preparation of the individual layers which are molded into one single package is very time-consuming and costly. Since the electronic equipment requiring the use of such complicated two-plane and particularly multiplane circuit boards is basically highly complex, circuit alterations in the course of the development of such equipment are practically unavoidable and have to be dealt with by necessity. Such alterations or changes may be partly "improvised", to begin with, by destroying undesired conductor tracks by separating bores or by externally attaching connections composed of circuit wire. However, in order to come to a solution which does not require such improvising or which can be implemented at least largely without improvisation and which is suitable for normal production, it is necessary, to start with, to test the altered circuit diagram in a new series of tests carried out with the altered circuit boards. This necessitates, first of all, the preparation of revised or changed drawings, the preparation of new prepregs based on said drawings with patterns of conductor tracks as specified in the diagrams, then the preparation of the laminate by molding, providing the latter with the pattern of bore holes and subjecting the board then to the process steps for metallizing the walls of the holes.

Disregarding the quite considerable costs both of the first model preparation and each change this conventional method of producing multiplane circuit boards with its considerable expenditure in terms of time starting with the first design of the circuit and circuit alterations to the finished multiplane circuit board represents an extremely costly delay in the course of manufacture of the associated equipment that is detrimental to the course of the development work.

It is the objective of the present invention to significantly reduce the design and production work and to make this work more economical.

It has already been proposed to arrive at a suitable solution by applying techniques other than the one of printed circuit boards. For example, connection networks such as WIREWRAP(TM) and STITCH WIRE(TM) were proposed for such purposes. These techniques did find their market for certain fields of application, however, they are not suitable as solutions to the problem on hand in the present case. The first technique leads to entirely different connecting networks both in terms of space requirements and electrical performance as compared to circuit boards of the type of printed circuits; similar conditions apply to the second-mentioned technique which, in addition, has the disadvantage of very high costs and restrictions with respect to the achievable density of conductor tracks. The technique that has become known under the name MULTIWIRE(TM), in connection with which the network of conductor tracks consists of insulated circuit wire, was successfully introduced for certain applications; its field of application overlaps the one of multiplane circuit boards comprising a great number of conductor track planes. Since the MULTIWIRE process did open the way from the circuit diagram to the circuit board without detour by way of drawings of the conductor track diagrams as compared to multiplane circuits of the type of printed circuit boards, said process already permits an acceleration of the prototype production process and also of the introduction of changes. However, also the MULTIWIRE process still requires for each electrical circuit for the preparation of the wiring diagram the computer-assisted preparation of the circuit documentation needed for the manufacture of the circuit models, which means that also this process is no solution to the problem on which the present invention is based.

It has been proposed also to simplify the working steps involving the break-down and manufacture of multiplane circuit boards by separating the product into planes with portions of circuit tracks on the X- and Y-axes. However, the relatively low conductor density per unit of area achievable by this method, as well as other limitations made its practical utilization impossible.

The present invention permits the production or manufacture of multiplane circuit boards without requiring the preparation of specific, different conductor track diagrams or drawings for different multiplane circuits. The method according to the invention makes use of premanufactured units which are used for all circuit boards produced thereafter. Depending on the complexity of the multiplane circuit to be produced use is made of one or a plurality of semi-finished units hereinafter referred to also as "multicircuit units" which, in the latter case, are press-molded to form one circuit board. The desired final thickness of the circuit board of, for example, 1.5 millimeters is achieved in a simple manner by using suitable prepregs for molding the board, because it is possible to prepare the conductor tracks themselves from thin material.

Since the multicircuit units are semi-finished products which can be stored, said units can be manufactured in an economical way in large series and carried in stock until needed.

Their individual pattern of conductor tracks or trains of the desired multiplane circuit, i.e., the "personality" of the circuit, is achieved by merely providing it with punched patterns of which the one has metallized hole walls in the finished product, hereas the other is free of such hole wall metallization.

Apart from the fact that according to the present invention drawings or diagrams of the layers of the multicircuit units are prepared only once and said units are manufactured as semi-finished products that can be stored, the method of the present invention omits all work involved in the preparation of drawings or diagrams and the preparation of individual layers for building up a multiplane circuit. This means that practically all important time-and labor-intensive processing steps known in the conventional manufacturing technique for producing multiplane circuit boards are omitted. Alterations of the electrical circuit or of the component insertion diagram may be taken into account in the method of the invention in a simple manner that saves costs and time. Any such changes are made on the same premanufactured multicircuit units and it is necessary only to change the drilling specifications for the preparation of holes with and without metallized walls. The finished product according to the invention conforms in all important respects with conventional circuit boards of the type of printed circuits. The method and the finished product are suitable for the manufacture of prototypes during the development stage as well as for the production of series. In terms of function the circuit boards of the present invention largely or completely correspond with conventional multiplane circuits with respect to space requirements, their basic structure and their electrical properties.

The circuit boards according to the invention are referred to as multicircuits, which are composed of one or a plurality of multicircuit units or contain one or a plurality of such units. Each unit consists of four planes or planar members supporting patterns of conductor trains or tracks. Two of the planes are provided with identical patterns of "connecting areas" which are structured in accordance with the invention. The connecting areas are arranged in each case in rows parallel to each other, with the spacings of said rows corresponding with forty times the selected standard or unit grid spacing; the center points of the connecting areas in each row are also disposed with forty times the spacing of the selected unit grid.

The two conductor track planes with connecting areas associated with one unit are disposed one on top of the other and displaced against each other in a way such that their center points on the X- or Y-axes are in each case arranged in rows which on the two planes are displaced against each other in each case by twenty times the grid spacing. This produces the embodiment of the connecting areas according to the invention as specified in the following in greater detail, in which the peripheral connecting points of the connecting areas disposed on the one plane and those of the connecting areas disposed displaced on the other plane are arranged one on top of the other separated by the layer of insulating material, and thus arranged coincidentally when viewed from the top vertically to the surface of the planes.

According to the invention each connecting area is structured in such a way that a number of connecting positions as well as separating positions are arranged in a geometrically defined manner in relation to the center point of a central position hereinafter also called the insertion position. If the origin of a cross of coordinates is placed in the center of the insertion position the following arrangement of the above position is obtained in accordance with the invention:

The connecting positions disposed on the X-axis are located with a spacing of $-8R$ and $+12R$ from the insertion position, with R specifying the selected unit grid spacing. Analogous thereto, the two connecting positions disposed on the Y-axis are located with a spacing of $+8R$ and $-12R$ in each case from the center of the central or insertion position.

An additional connecting position is in each case disposed on an axis extending with 45° through the center point and has the coordinates $-6R, -6R,$ and $+6R, +6R,$ respectively.

Furthermore, a position is provided in each case on the X- and Y-axes. Said position serves as the location for providing interruptions. The center point of interrupting borings or holes to be provided at said location is hereinafter called the interrupting position.

The interrupting position located on the X-axis is spaced by $+7R$ from the origin of the coordinates and the one disposed on the Y-axis by spacing $-7R$.

It is to be noted here that it is possible to use in the same way a mirror-inverted arrangement of all connecting and interrupting positions.

The connecting areas, which are basically determined by the locations of the connecting positions, are advantageously structured according to the invention in a way such that when providing "connecting borings'-'—their modes of operation are specified hereinafter in detail—with a selected diameter drilled on the periphery of the connecting areas, a ring of desired width will remain, said ring being concentric to the center of the connecting bore hole and corresponding, for example, with one unit grid spacing.

Furthermore, each multicircuit unit consists of a plane with conductor tracks disposed parallel to each other and to the X-axis, and a plane with conductor tracks disposed parallel to each other and to the Y-axis. The individual tracks disposed parallel to each other have a spacing which, between adjacent trains of conductors, corresponds with twenty times the unit grid spacing. The conductor width is selected in such a way that a sufficient lateral marginal zone is retained when providing or drilling a bore hole penetrating such a conductor track. For example, a conductor track width of 4R was found to be suitable if, for example, 3.5 unit grids is selected as the hole diameter for bore holes drilled in connecting positions and interrupting positions, and 7.5δ is selected for those in insertion positions.

The conductor plane with tracks on the X-axis is arranged in relation to the conductor tracks plane(s) with connecting areas in a way such that the center lines of the tracks extend coincidentally with the imaginary lines extending through the center point of the connecting positions of those connecting areas with coordinates −6R, −6R based on the centers of the insertion positions as the origin of coordinates.

Advantageously, the width of the conductor tracks is reduced in the parallel conductor tracks at those points corresponding in the multicircuit unit with the interrupting positions, in order to facilitate a reliable interruption or break. The contraction of the conductor tracks within the zone of the interrupting positions of the connecting areas having coordinates −7R, O is dimensioned in such a way that the center line of the narrowed track extends through the center points of said interrupting or break positions. In the above example, this would mean bisecting the original width of the conductor track (2R).

The plane provided with conductor tracks extending parallel to the Y-axis is in this way arranged on top of the package consisting of the two planes with connecting areas and the plane with the conductor tracks on the X-axis, namely in a way such that the center line of each conductor track parallel to the Y-axis is extending with the center point of the associated insertion positions of the connecting areas through the center point of the connecting positions with coordinates +6R, +6R. Also the conductor tracks of said plane are usefully provided with contractions within the zone of the associated interrupting positions, namely analogous to the tracks on the X-axis plane. Said interrupting or break positions correspond with coordinates 7R, O on the planes comprising connecting areas, in each case in relation to the center point of the insertion positions of the connecting areas. The contractions are in each case arranged separated from each other by a spacing of 2OR, the latter being defined by the break positions.

The package consisting of the two layers arranged as specified above and supporting the connecting areas, a layer with a layer supporting conductor tracks on the X-axis and a layer with a plane supporting tracks on the Y-axis is molded by hot press-molding to form a multicircuit unit, using the method known for the manufacture of multiplane circuit boards.

The multicircuit units are storable semi-finished products which can be manufactured in economical quantities for stock-keeping.

The conductor tracks desired for a specific purpose of application and thus a specific circuit board having the desired pattern of conductor tracks is manufactured by providing or drilling the board with connecting or interrupting bore holes in predetermined connecting and interrupting positions as required for the desired pattern of conductor tracks. The connection between track portions disposed on different planes is produced as hereinafter specified in greater detail by known metallization of the walls of the bore holes. The depositing of the metal coating on the walls of the bore holes in the connecting positions is carried out while metallizing at the same time also the walls of the insertion bore holes provided in the insertion positions for connecting components and/or interconnecting conductor tracks.

If a higher track density per unit of area of the finished circuit board is desired, two or more multicircuit units are used. In this case, the connecting or interrupting bore holes associated with each unit normally are prepared first and completed as specified above. Subsequently, the multicircuit units are press-molded to form one single unit, using the known method of circuit board technology, with prepregs sandwiched in between. The connection between conductor tracks of different units is produced by bore holes having metallized walls and drilled in the predetermined insertion positions. If an insertion position is not to serve as a connection between tracks of different units and/or for connecting system components it was found to be advantageous to provide the respective position with a bore hole prior to the press-molding of the units. During the molding step said bore hole is then filled with resin, which produces a reliable insulation.

The insulation between the units is produced by means of intermediately arranged layers of prepregs or other suitable insulating materials.

According to another embodiment of the present invention it was found to be advantageous if the planes having connecting areas are in each case provided with circular metal surfaces which are not connected to each other. Said metal areas, with respect to their arrangement, correspond with the insertion positions of the connecting areas of the two planes provided with such areas, namely in the displaced position specified above. Furthermore, the planes are in each case provided with circular metal surfaces which, analogous to the connecting positions, correspond with coordinates −6R, −6R and +6R, +6R of the other plane.

Multicircuit boards consisting of one or a plurality of multicircuit units may be adapted, as mentioned above, to the predetermined thickness by placing prepregs between the planes. Usefully, the prepreg layers of the individual planes forming the multicircuit unit are selected sufficiently thin to obtain by the addition of prepregs a thickness of, for example, 1.5 mm for the finished multicircuit board formed by a plurality of units.

In another embodiment of the present invention, one or both external surfaces of the circuit board composed of one or a plurality of units is clad with copper foil or provided in some other known way with a layer of copper which also, in turn, serves in the known manner for building up additional, specific patterns of conductor tracks, for example, track patterns serving the power supply or for sheathing purposes. In the same way, it is possible to provide areas for connecting surface-mounted system components. Such conductor track patterns can be produced also by another known method, for example, by application of the so-called additive technique.

The present invention is explained in greater detail with the help of the drawings in which.

Figure 2:
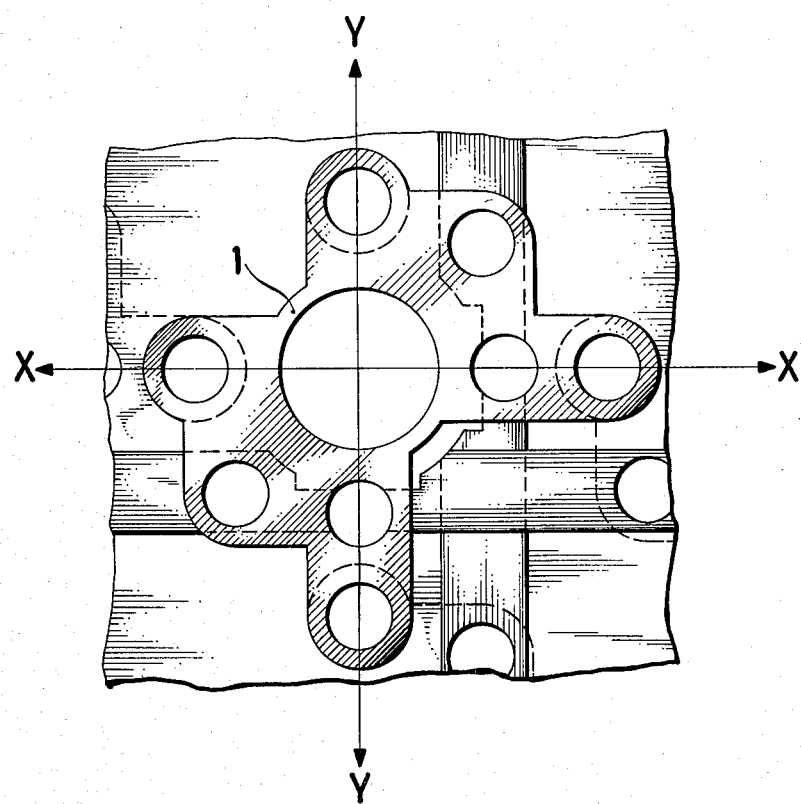
FIG. 2 is a schematic view drawn true to scale with respect to the unit grid spacing, showing the arrangement of the two planes (A, B) supporting the connecting areas, the layer (C) provided with conductor tracks on the X-axis, as well as the layer (D) provided with conductor tracks on the Y-axis.
Figure 2A:
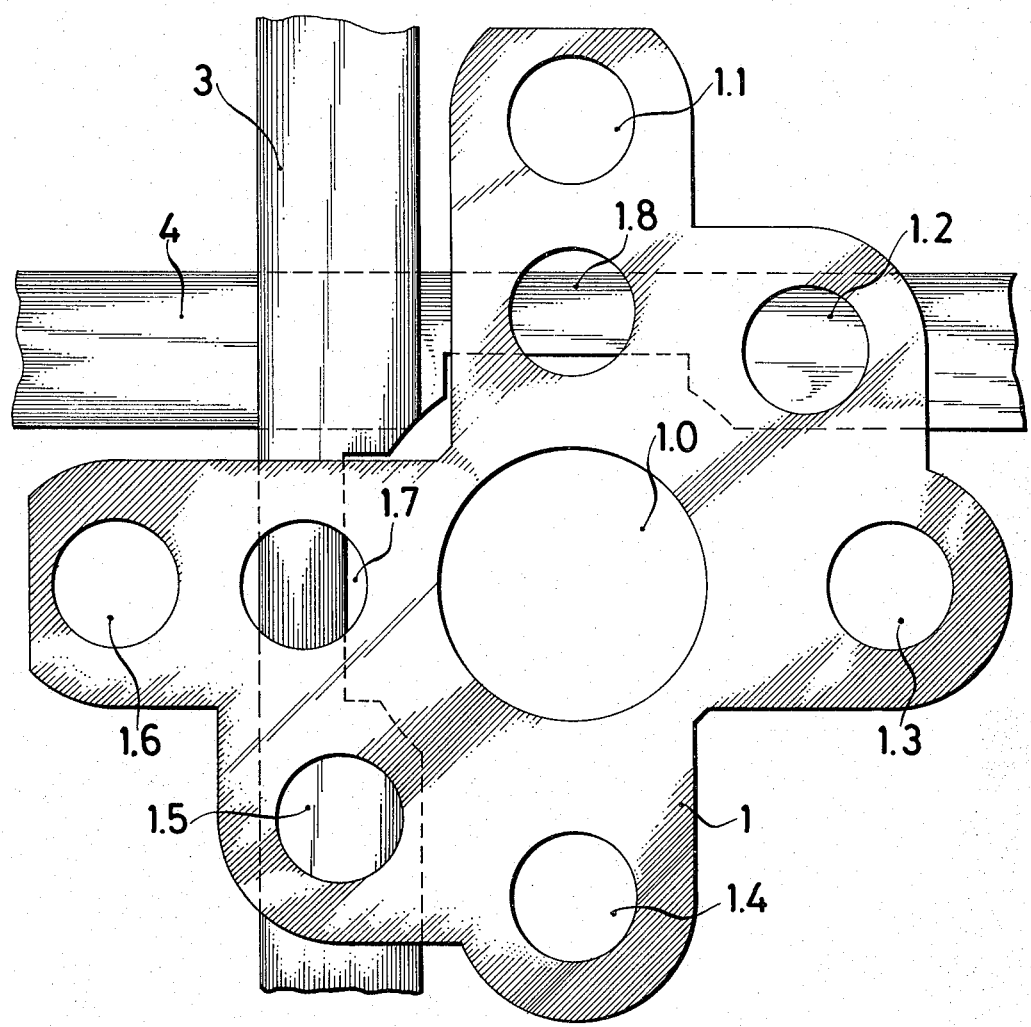
Figure 3:
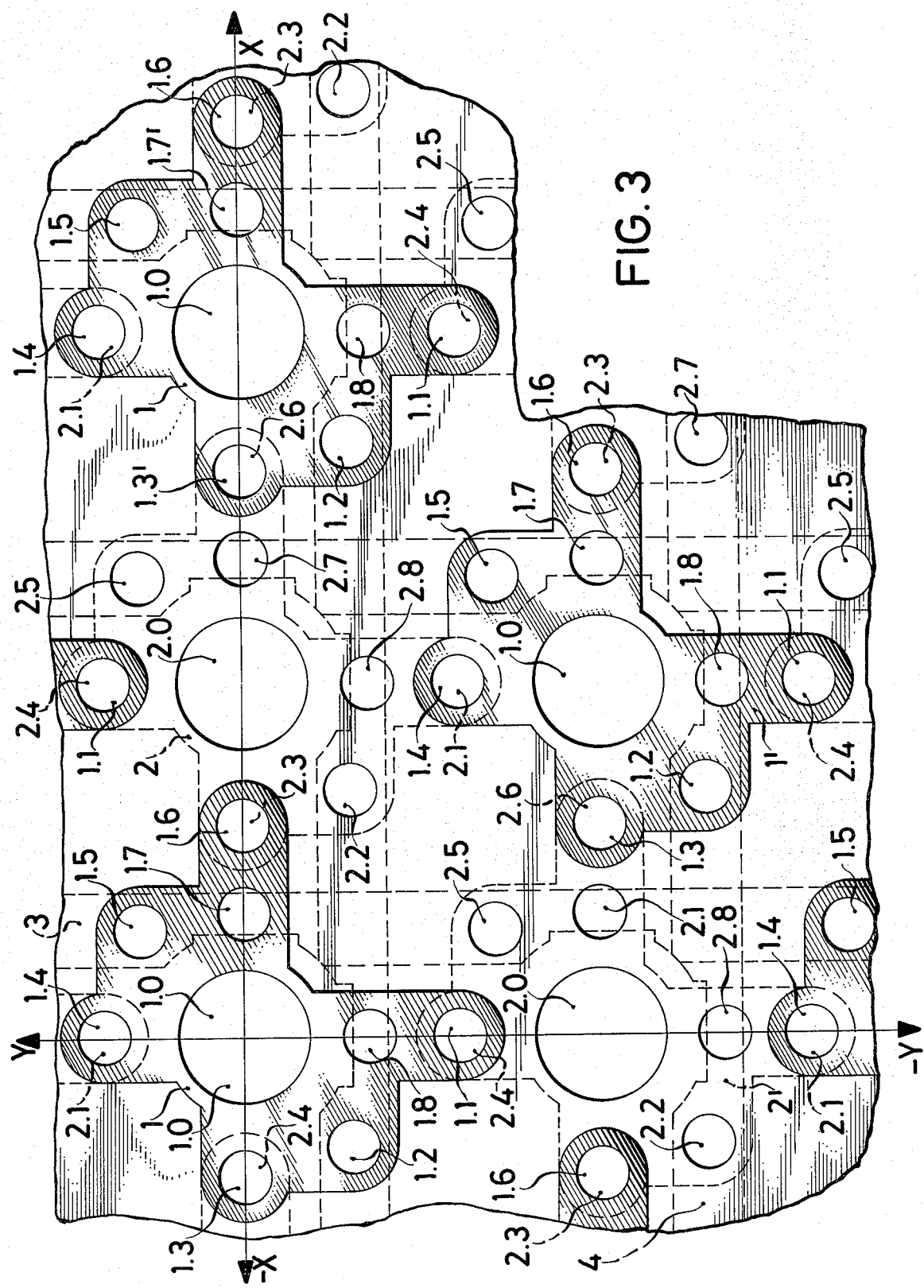
Figure 4:
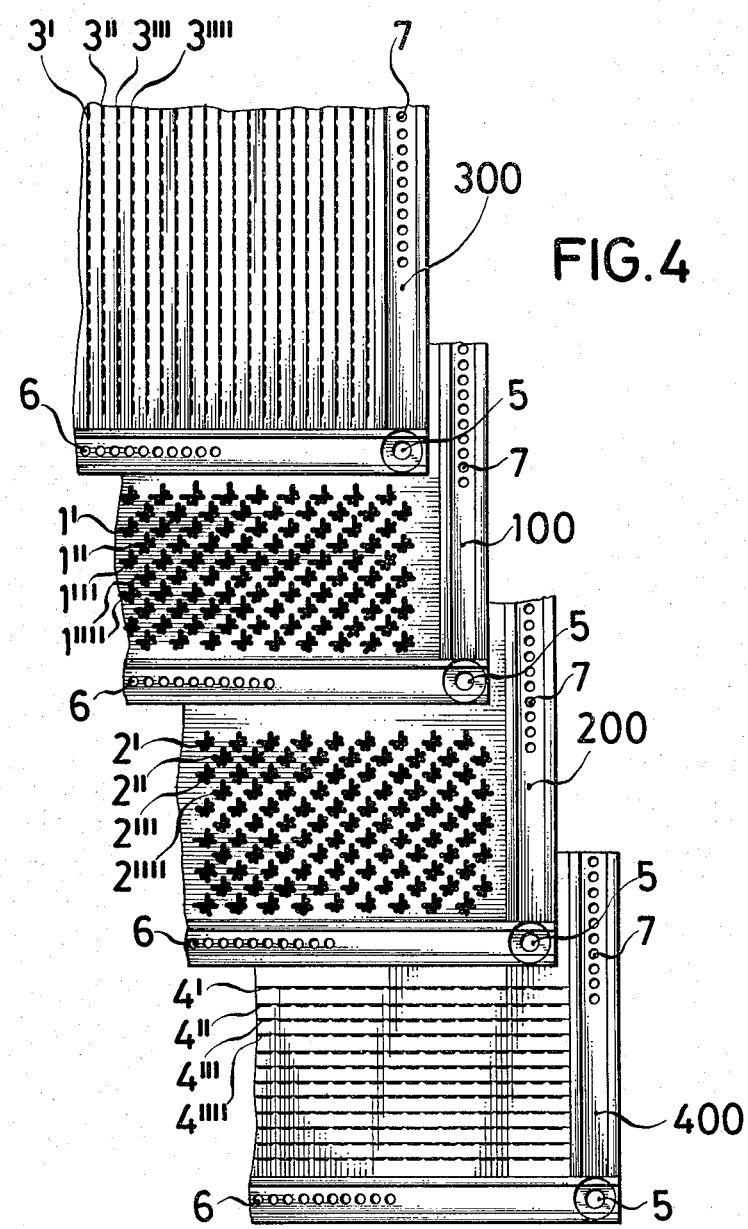
Figure 5:
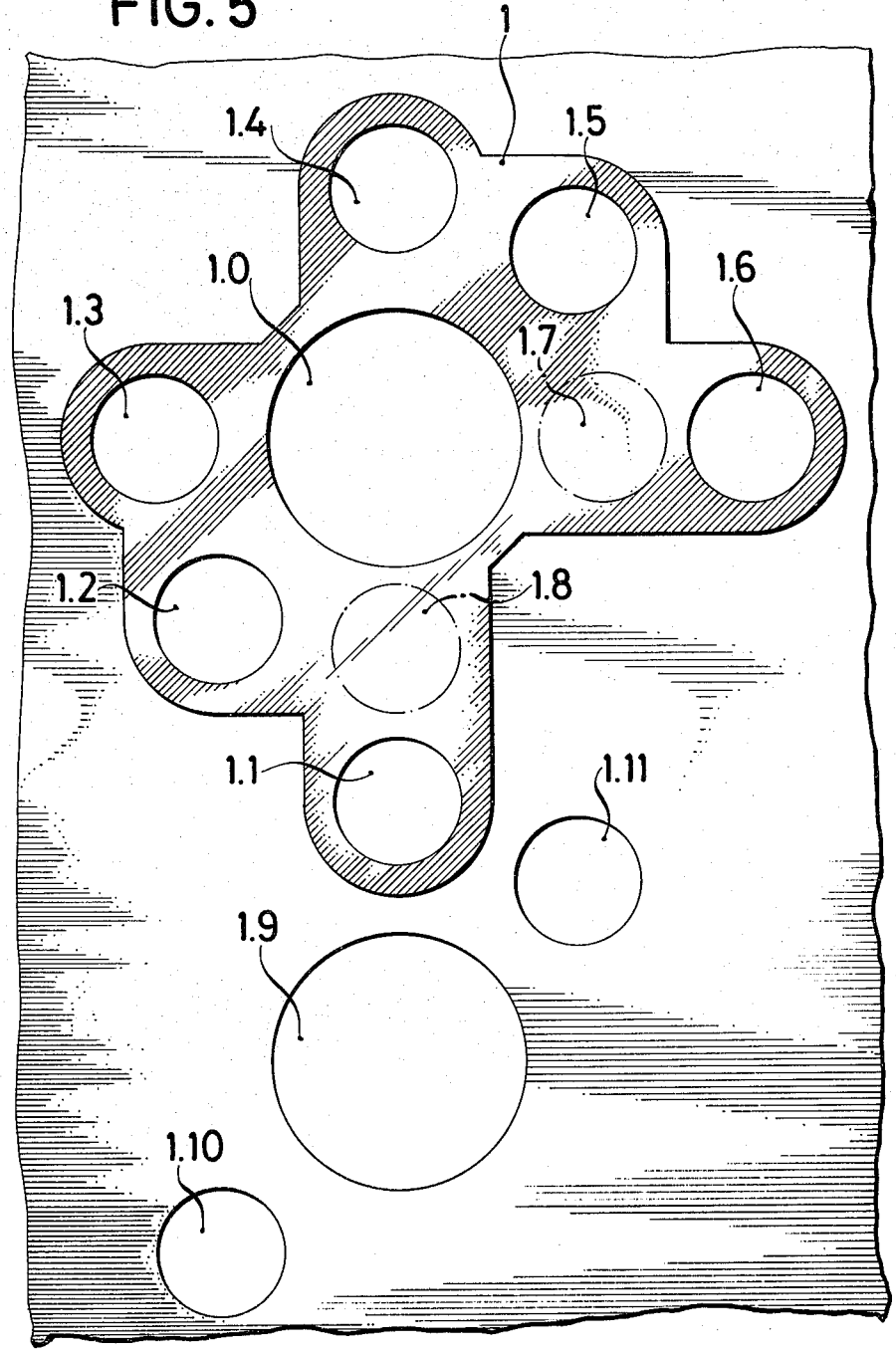
Figure 6A:
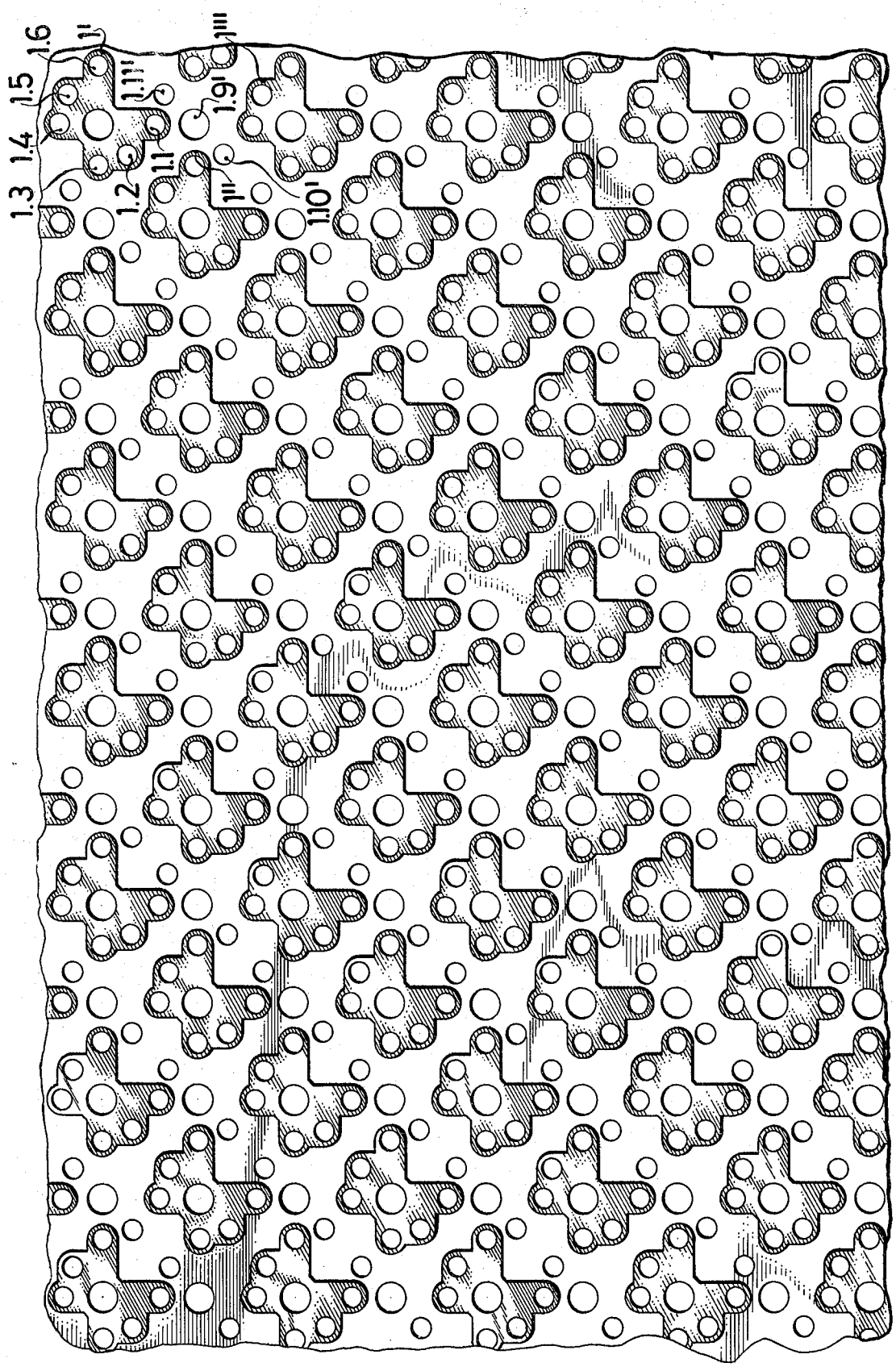
Figure 6C:
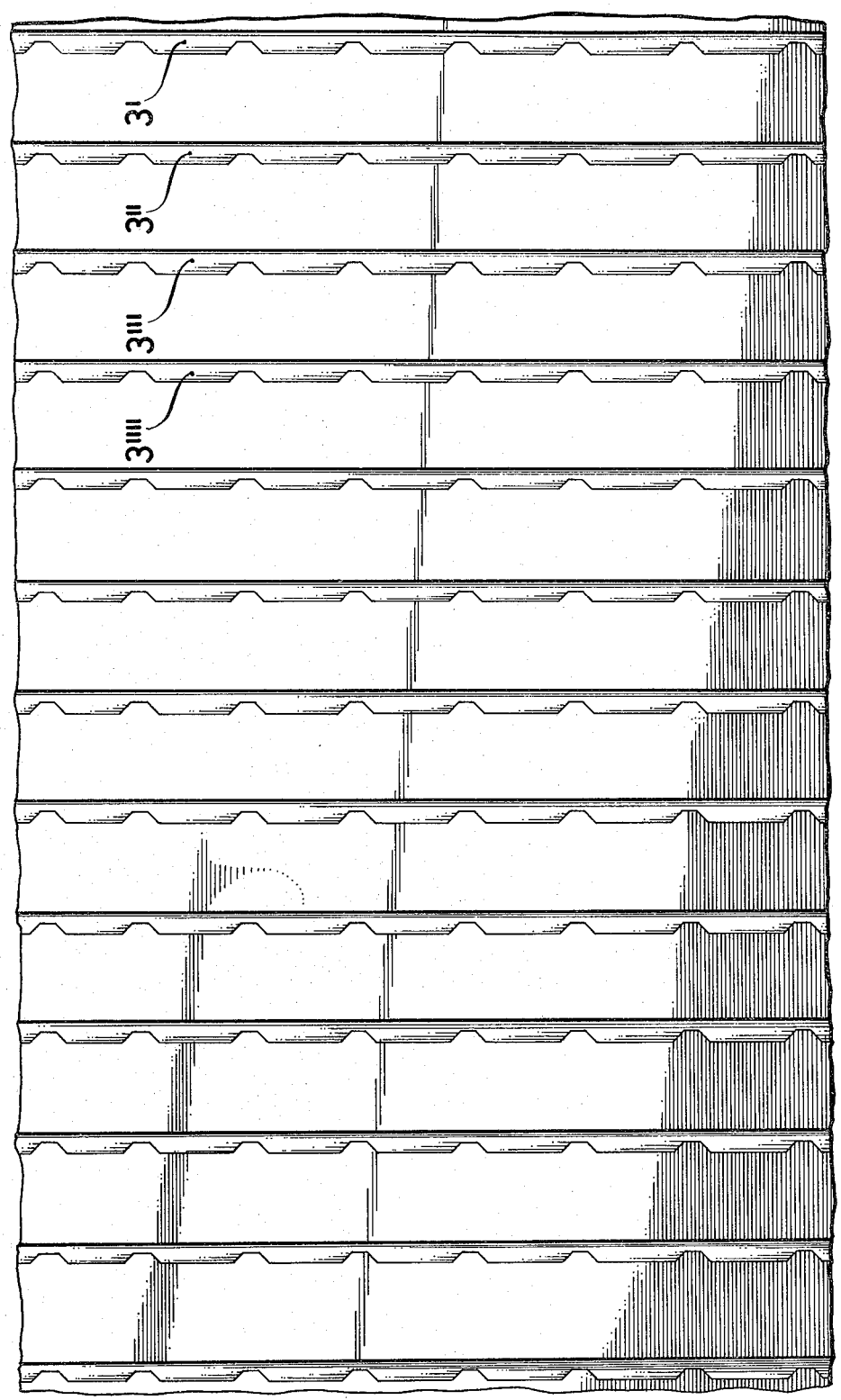
Figure 6D:
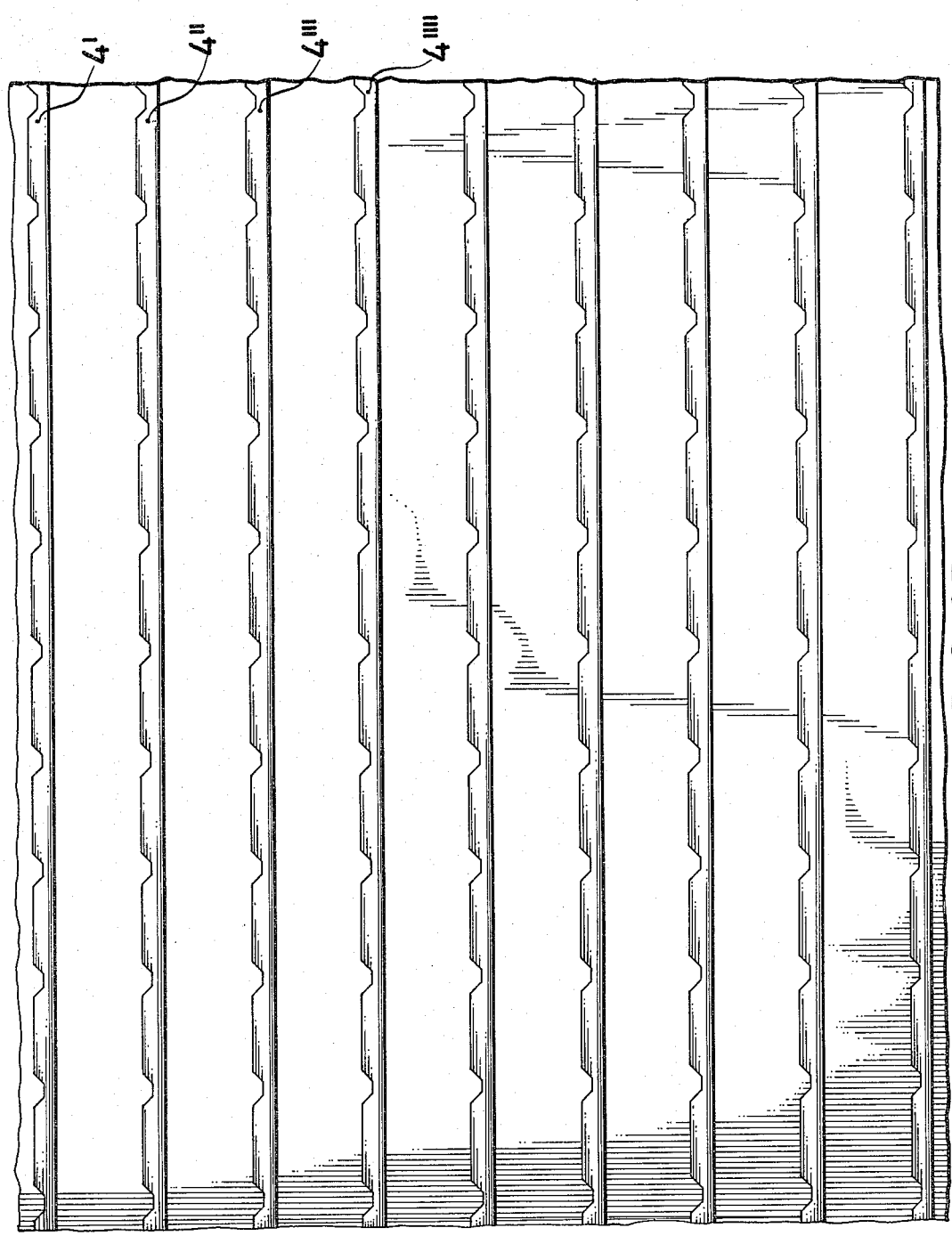
Figure 7:
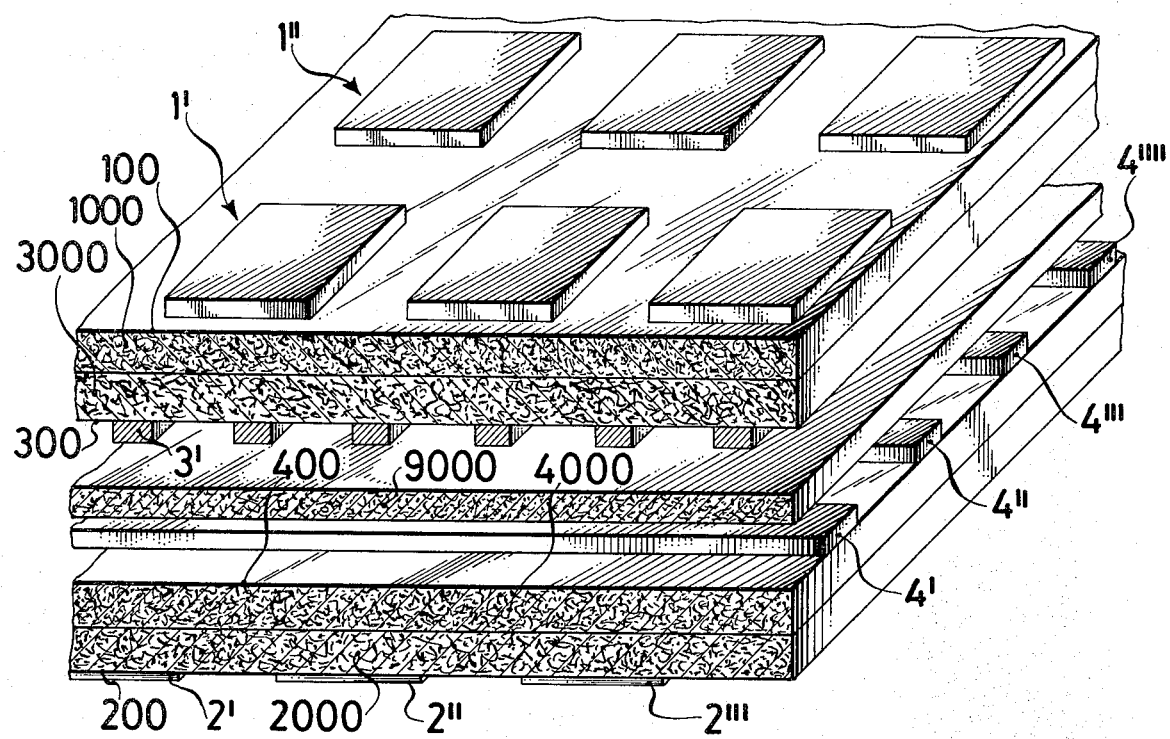
Figure 8:
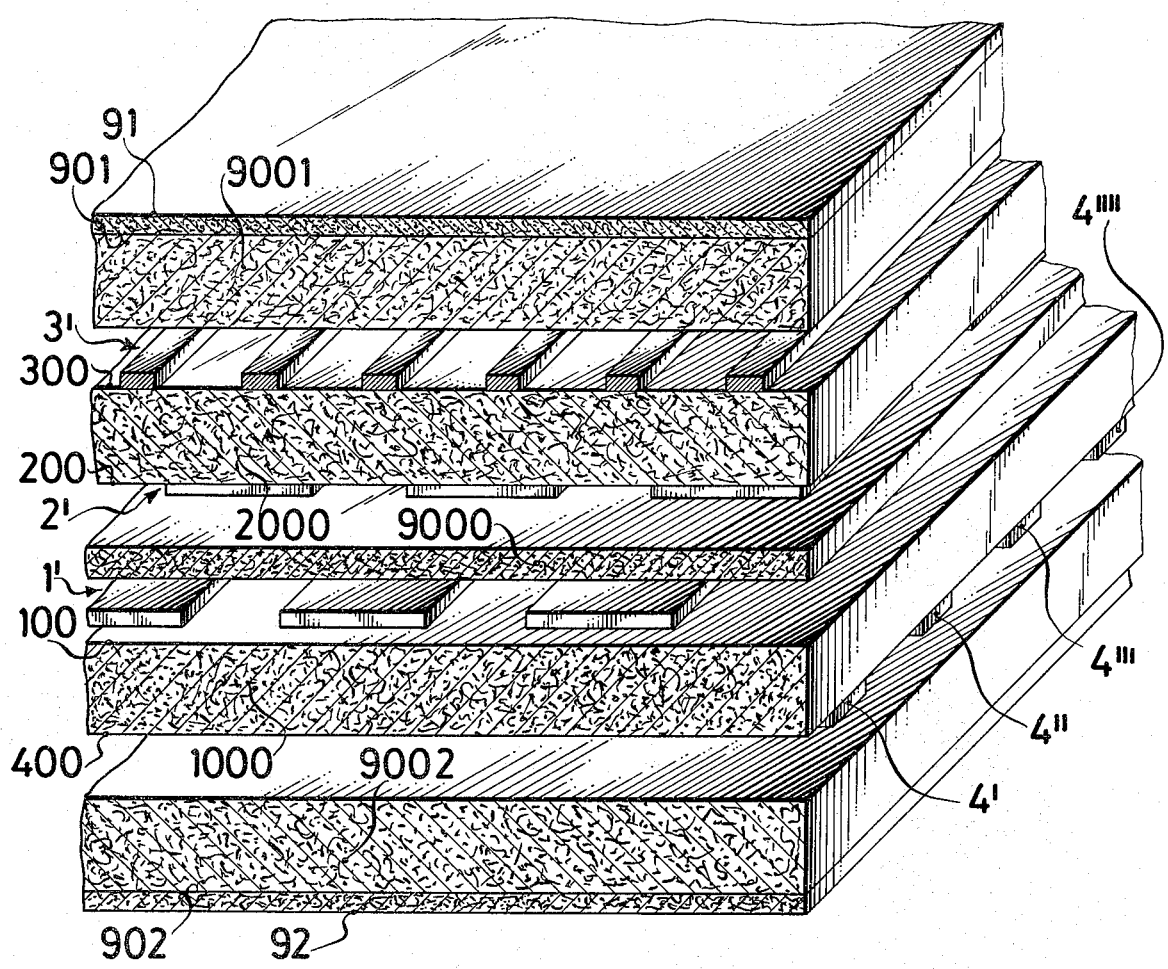
Figure 9:
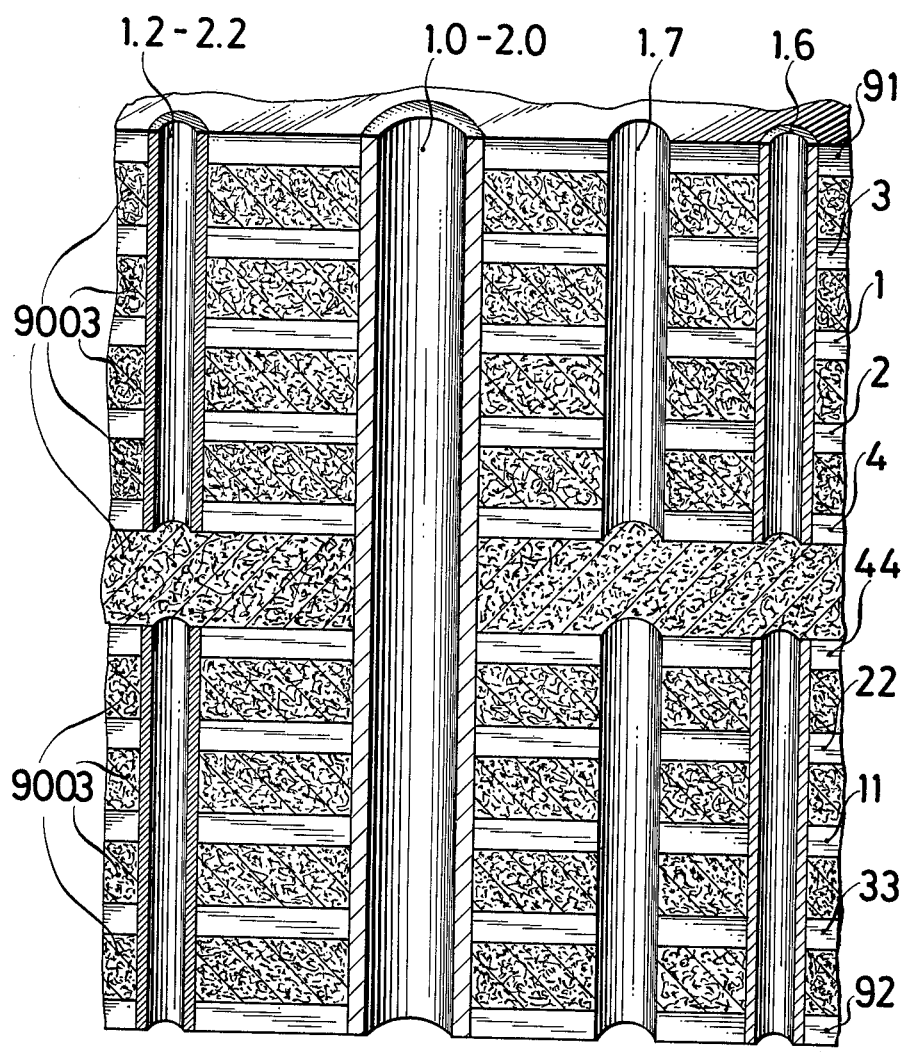

FIG. 2A shows an enlarged view of a connecting area 1 as well as a conductor track 3 on the Y-axis and a track 4 on the X-axis;

FIG. 3 shows a connecting area with positions for insertion, connecting and interrupting bore holes plotted with the unit grid spacing;

FIG. 4 is a schematic view of the four layers with their track patterns forming after molding the semi-finished product called the multicircuit unit;

FIG. 5 shows a connecting area in which both the outline and the bore hole positions are arranged in a mirror-inverted way (except for the insertion borings);

FIGS. 6A to 6D show the track patterns of the four planes forming one unit;

FIG. 7 illustrates a schematic view of a multicircuit unit;

FIG. 8 shows, also in a schematic view, a unit which, however, comprises not only the four layers of FIG. 7 arranged in a different way but additionally also two outer layers available for track patterns, thus six planes of track patterns;

FIG. 9 is a schematic view of a multicircuit board consisting of two units having, in accordance with FIG. 8, additional track planes on the outside surfaces and thus a total of ten planes of conductor patterns.

Figure 10:
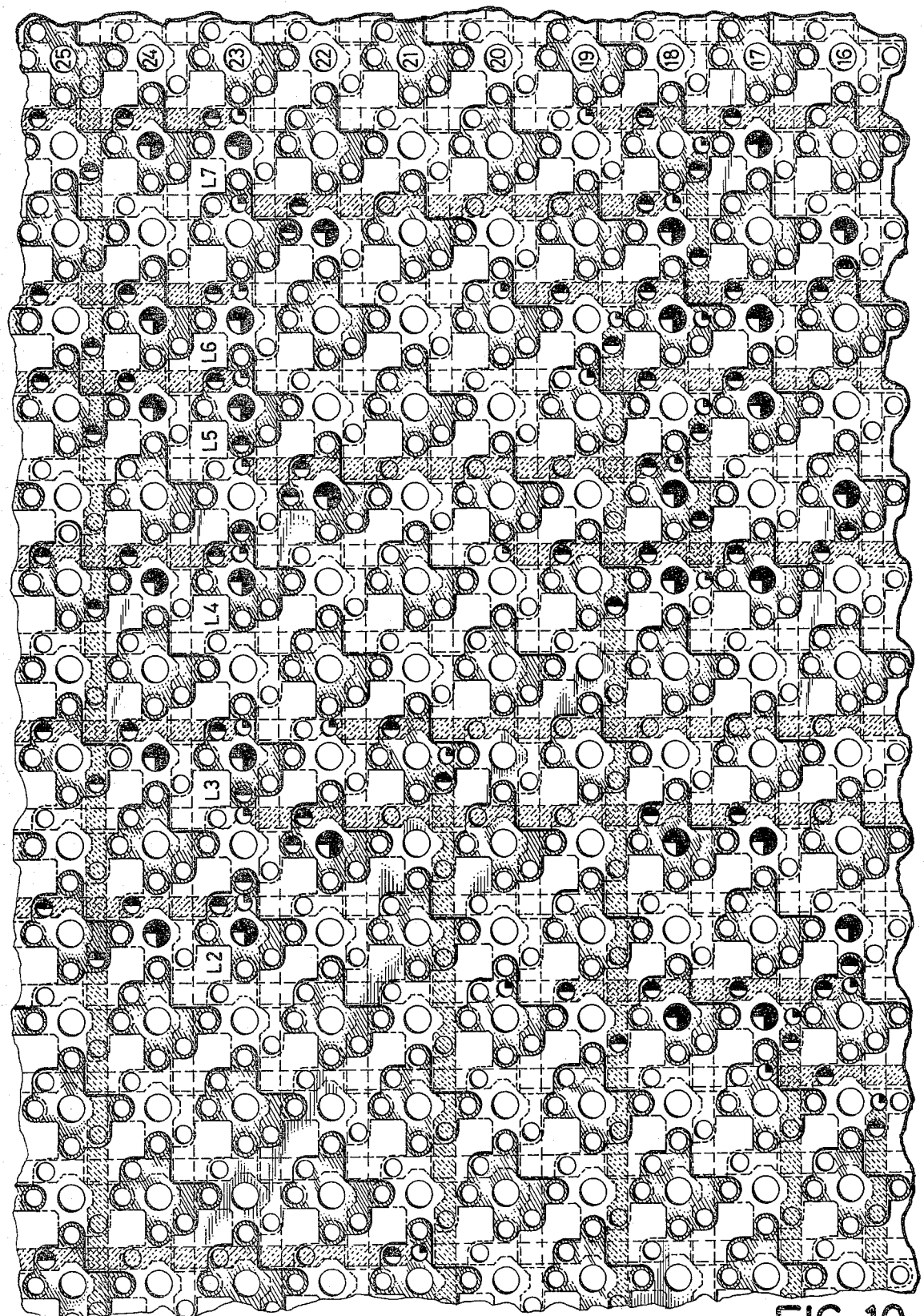

FIG. 10 is a schematic block diagram showing the processing of multicircuit components in accordance with the invention.

Figure 1:
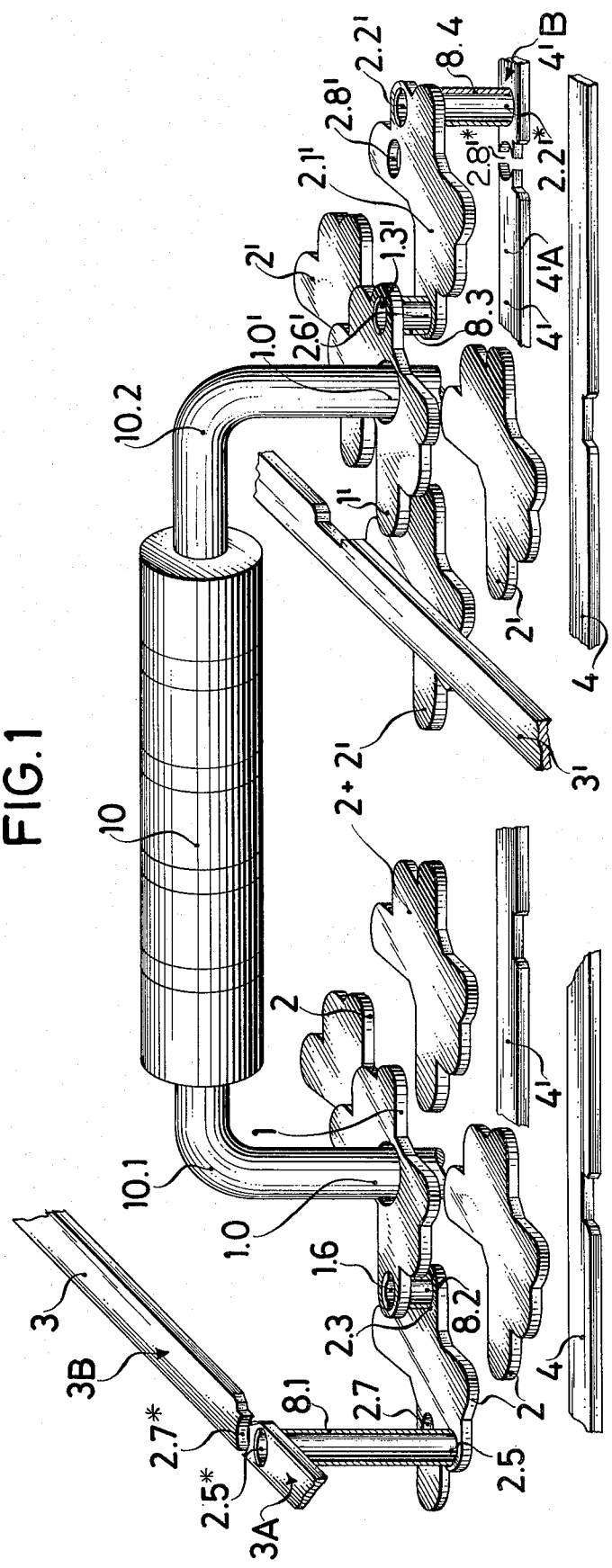
FIG. 1 is an axonometric, schematic view of a multicircuit unit in which the layers of insulating material are omitted.

In FIG. 1, 1 and 1' are connecting areas belonging to a first plane and 2 and 2' are connecting areas disposed beneath on a second plane. The conductor tracks extending in the Y-direction are identified by 3 and 3' and the tracks extending in the X-direction by 4 and 4'. The insertion bore holes 1.0 and 1.0' provided in connecting areas 1 and 1' serve for connecting a component 10 having connecting leads 10.1 and 10.2. The connecting area 1 is connected to connecting area 2 by way of connecting bore hole 1.6, connecting bore hole 2.3 and hole metallization 8.2. Said connecting area 2 is in turn connected to conductor track 3 by way of connecting bore hole 2.5, hole metallization 8.1 and bore hole 2.5*, the latter penetrating said track within its zone 3A. By providing the position 2.7 and the interrupting or breaking bore hole 2.7* in conformity with connecting area 2 portion 3B of conductor track 3 is electrically separated from portion 3A.

The connecting area 1' is connected to connecting area 2' by way of connecting bore hole 1.3', bore hole wall metallization 8.3 and connecting bore hole 2.6', said connecting area 2' in turn being connected to section 4'B of track 4' by way of connecting bore hole 2.2', bore hole wall metallization 8.4 and connecting bore hole 2.2'*. By providing the interrupting bore hole 2.8' conductor track 4' is separated in position 2.8'*, so that its portion 4'A is electrically separated from portion 4'B, which is in connection with connection area 2.1'.

FIGS. 2 and 2A illustrate a connecting area 1 with its outline as well as the positions for insertion, connecting and breaking bore holes drawn true to scale with the unit grid spacing, with the coordinates indicated in relation to insertion position 1.0 as the origin of coordinates. The connecting positions 1.1 with coordinates O and −12R; 1.3 with coordinates −8R and O; 1.4 with coordinates O and 8R; and 1.6 with coordinates 12R and O serve or producing the connection to connecting areas on the second plane with connecting areas.

The connecting positions 1.2 with coordinates −6R, −6R and 1.5 with coordinates +6R, +6R; the positions 1.7 with coordinates 7R, O; and 1.8 with coordinates O, −7R serve for localizing separating bore holes for separating conductor tracks extending in the Y-direction (FIGS. 1 and 2A), as well as tracks extending in the X-direction (4 in FIG. 2A and 4' in FIG. 1, respectively).

If a unit grid spacing of 0.127 millimeters is selected the insertion bore holes are provided at the required points, for example with a diameter of 0.95 mm. and connecting and breaking or interrupting bore holes with a diameter of 0.45 mm.

FIG. 3 shows in a schematic view (cutout) the geometric orientation of the connecting areas as well as the conductor tracks of the four planes of a multicircuit unit. In this case, the connecting areas of the first plane with connecting areas in the first row are identified by 1 and those in the following row by 1', and the connecting areas of the second plane with connecting areas in the first row by 2 and those in the following row by 2'. The conductor tracks provided on the third plane in the Y-direction are identified by 3 and the tracks on the fourth plane extending in the X-direction are identified by 4.

The spacing of the insertion positions on each of the planes supporting connecting areas is 4OR, which for the molded multicircuit unit results in a spacing of 2O R for each of the possible insertion bore holes both in the X- and Y-directions. With a unit grid spacing of 0.127 mm this corresponds with a hole spacing grid of 2.54 mm.

As stated above, the connecting areas are displaced in each case in the X-direction by twice the center point spacing of their peripheral connecting positions. The rows of connecting areas of one connecting plane are disposed displaced against each other in the X- and Y-directions in each case by the single spacing of the peripheral connection positions. The patterns of connecting areas of the two connecting planes are basically identical. However, in the multicircuit unit according to the present invention the planes are arranged one on top of the other in such a way that when viewed from the top, the center points of the insertion positions of the individual connecting areas of the one plane are displaced against those of the other plane by the spacing of the peripheral connecting positions of one connecting area, with the result that associated, peripheral connecting positions of connecting areas on different planes coincide when viewed from the top.

Based on the preferred embodiments of the invention the following is obtained: on each connecting plane, the rows of connecting areas are disposed with a spacing of 20 unit grid spacings (R). In each row, the center points of the insertion positions of the individual insertion areas are arranged with spacing corresponding with 4OR; a connecting line drawn through the center points of the insertion positions of connecting areas of adjacent rows in each case is disposed displaced by 2OR.

If, as shown in FIG. 2, the origin of the coordinates is placed in the center point of an insertion position of a connecting area, the coordinates of the center points of the insertion positions of the same row are O,O; 4OR, O; 8OR, O; 12OR, O; . . . ; those of the next row of the same connecting plane are 2OR, −2OR; 6OR, −2OR; 10OR, −2OR; . . . ; and those of the next-following row are 2OR, −4OR; 6OR, −4OR; 10OR, −4OR; . . . etc.

The insertion areas of the second connecting plane are arranged in the same way per se, however, the planes are disposed in the multicircuit unit displaced against each other in such a way that the center points of the insertion positions of the connecting areas of the second plane have the coordinates 2OR, O; 6OR, O; 10OR, O; 12OR, O; . . . in the first row (in relation to the above-defined coordinate origin); and in the following row O, −2OR; 4OR, −2OR; 8OR, −2OR . . . .

According to the invention, the track planes with conductor tracks 4 extending in the X-direction are arranged in such a way that the center line of the conductor tracks connects in each case the center points of the connecting positions 1.2 in FIG. 3. In the same way, the conductor tracks 3 in the Y-direction are arranged in relation to the connecting positions of connecting areas 1.5. According to one embodiment of the invention, the width of the conductor tracks is reduced or narrowed in each case within the neighborhood of connecting positions 1.8 for conductor tracks extending in the X-direction, and within the zone of 1.7 for tracks in the Y-direction, so that within said zones of a track the center line coincides with the center point of the associated interrupting position, as this is shown in FIG. 2A. The track pattern of the respective planes thus has periodic contractions disposed with spacing of 2OR from each other. The track rows themselves also have a spacing of 2OR from each other.

FIG. 2A shows an enlarged view of a connecting element 1 from FIG. 2 and a conductor track 3 extending in the Y-direction and a track 4 in the X-direction.

The circles shown in FIGS. 2, 2A and 3 in each case around the associated positions forming the center points indicate by way of example the hole diameters for the bore holes to be provided in said positions, however, bore holes are drilled only in those positions in which such holes are required for connecting or separating purposes or for connecting system components.

FIG. 4 is a schematic view of the four layers forming one unit, omitting any insulating or separating layers that may be used. In this figure, 100 identifies the plane of connecting areas provided with connecting elements 1, on which plane the connecting areas are arranged in rows 1', 1'', 1''', 1'''' etc. Said plane of connecting areas also supports the pilot markings 6 and 7, a pilot hole disposed in a corner is identified by 5. The arrangement of pilot holes as well as of registration markings is the same for all four layers and provided in FIG. 4 with identical reference symbols. The second plane 200 with connecting surfaces disposed beneath plane 100 supports the rows of connecting areas 2', 2'', 2''', 2'''' etc.; the two outer layers 300 and 400 are provided with conductor tracks 3', 3'', 3''', 3'''' etc. in the Y-direction and 4', 4'', 4''', 4'''' etc. in the X-direction.

It is to be noted that the sequence of individual layers is exchangeable per se and freely selectable. Also, according to another embodiment of the invention it is possible, for example to arrange the connecting areas 1', 1'' etc. on the one plane and connecting areas 2', 2'' etc. on the other plane on an insulating carrier, for example, composed of a suitable, glass fiber-reinforced oxide resin material. As a rule, however, prepregs with copper cladding or conductor track patterns provided on one side are used, of the type known in the manufacture of conventional multiplane circuits.

FIG. 5 shows a connecting surface produced as compared to those of FIG. 3 by mirror-inversion by rotation around the X- and Y-axes, which in the same way is suitable for the manufacture of multicircuit boards.

FIG. 5 shows the additional positions 1.9, 1.10 and 1.11 with metal surfaces shown around said positions forming the center points. Said surfaces correspond with the positions 2.2, 2.0 and 2.5 (FIG. 3) on the second plane of connecting areas. If the planes with connecting surfaces form the outer surfaces of the multicircuit unit said positions serve the purpose of permitting an arrangement of soldering terminals in said positions.

FIGS. 6A to 6D show the track patterns of the two planes A and B as well as plane C with tracks in the Y-direction and plane D with tracks in the X-direction.

FIG. 7 is a schematic view showing the multicircuit unit formed by the four layers in the form of a semi-finished product, with the connecting areas only drawn as rectangularly shaped elements for the sake of better clarity. In FIG. 7, 1' identifies the first row and 1'' the second row of connecting areas of the first plane 100 of carrier material 1000. Said carrier material is in contact with carrier material 3000 supporting on its track plane 300 the conductor tracks 3', 3'' etc. extending in the Y-direction. The carrier materials 2000 and 4000 support on connecting area plane 2OO the connecting surfaces 2', 2'' and 2''' and on track plane 400 the conductor tracks 4', 4'', 4''' and 4'''' extending in the X-direction. The surfaces supporting the conductor tracks 3', 3'' and 4', 4'' etc. are combined by press-molding with a prepreg 9000 placed in between.

FIG. 8 shows a structure that is basically similar to the one shown in FIG. 7, however, with the connecting surfaces 1' etc. on the one side and conductor tracks 4' etc. extending in the X-direction on the other side disposed on the planes 100 and 400, respectively, of the carrier material, whereas the connecting surfaces 2' etc. and the conductor tracks 3' etc. extending in the Y-direction are arranged on the planes 200 and 300 of carrier 2000. The two carriers 1000 and 2000 are combined by press-molding with the use of a prepreg 9000. Simultaneously, the planes 300 with conductor tracks extending in the Y-direction and 400 with tracks in the X-direction are joined by pressure molding with prepregs 9001 and 9002 with copper claddings 91 and 92. Said copper coatings serve the purpose of providing the product with additional track patterns of the general type or particularly with soldering terminals, connection terminals for surface-mounted system components and the like. In this case, the total number of planes with track patterns is six.

FIG. 9 shows by way of example in a schematic view the joining of two multicircuit units to form a 10-plane circuit board. 1 and 2 as well as 11 and 22 designate the planes supporting connecting surfaces; 3 and 4 as well as 33 and 44 are the planes with conductor tracks in the X- and Y-directions, respectively, whereas 91 and 92 designate additional planes with tracks provided on the surface. All insulating materials are identified by reference number 9003. The bore hole provided in the insertion positions 1.0 and 2.0 of the two units represents the connection between said two units by means of its metallized walls. The connecting bore hole in position 1.2 represents the connection to conductor track 1.2* and the boring provided in position 1.6 is the connection to the connecting area or surface on the second plane of connecting surfaces, namely in position 1.3. The interrupting or breaking bore hole disposed in position 1.7 interrupts track 3 extending on said plane in the Y-direction.

The connections desired in the second multicircuit unit are prepared or separated in a similar way.

For example, if no conductive connection is desired in a defined or specific position associated with an insertion bore hole, i.e., a connection extending from one unit to the next, said bore hole is filled with resin, for example either prior to or during the laminating operation combining the units, for example by using prepregs.

Other structures and embodiments of the basic concept of the present invention can be achieved by combining different connection and separation possibilities and different insulation and connections of a plurality of multicircuit units laminated to form one circuit board.

FIG. 10 is a schematic block diagram showing the processing of multicircuit components.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed:

1. Method of producing multiplane circuit boards, characterized by the fact that a planar member A is prepared first on a layer of suitable carrier material, said planar member A having connecting areas disposed in rows on said planar member A, each of said areas having an insertion position, six interlinking positions and two interrupting positions, said interlinking positions, based on the center point of the insertion position of each connecting area, having the coordinates $-8R, O$; $12R, O$; $O, 8R$; $O, -12R$; $-6R, -6R$; $6R, 6R$, and said interrupting positions having the coordinates $7R, O$ and $O, -7R$, with R being any selectable standard grid spacing, and said rows of connecting areas having between each other a spacing of 2OR and adjacent insertion positions in one row having between each other a spacing of 4OR;

that a planar member B is prepared, said planar member B per se having the same pattern as planar member A, however, with the two planar members A and B being arranged one on top of the other in a manner such that the connecting areas of planar member B bridge the spacing between those of planar member A, so that associated connecting positions of the connecting areas on the two planar members A and B coincide when viewed from the top;

that a planar member C is prepared, said planar member C being provided with trains of conductors parallel to the X-axis with a spacing of 2OR between said trains of conductors; that said planar member C is disposed in relation to planar members A and B in a way such that the center lines of each of their trains of conductors coincide with the imaginary connecting line through the center points of the associated connecting positions with the coordinates $-6R$ and $-6R$;

that a planar member D is prepared, said planar member D being provided with trains of conductors extending parallel to the Y-axis and having a spacing of 2OR between each other, and said planar member D being disposed in relation to planar members A and B in a way such that the center lines of each of their trains of conductors coincide with the imaginary connecting line through the center points of the associated connecting positions with coordinates 6R and 6R;

that the planar members A, B, C and D disposed as defined above are combined to form one mechanical unit, if necessary with the use of an intermediately arranged, suitable insulating material such as prepregs;

that one or a plurality of such units are provided with a pattern of conductor trains conforming with the desired circuit;

that defined connecting positions are provided with bores in accordance with the circuit diagram, said bores being provided in a manner known per se with a metal coating applied to their walls;

that bores are provided in the insertion positions determined by the circuit diagram, said bores being provided with metallized walls also; and furthermore, that the trains of conductors on the planar members C and D are separated into partial pieces insulated against each other, by means of bores provided in the interrupting positions determined by the circuit diagram.

2. The method, as defined in claim 1, characterized by the fact that the trains of conductors on the planar members C and D have contractions within the zones of the interrupting positions;

that the center lines of the narrowed portions of the conductor trains coincide with an imaginary connecting line connecting the center points of the interrupting positions with coordinates $O, -7R$ for the conductor trains on the X-axis and $7R, O$ on the Y-axis; and that the width at the narrowed point is less than the bore diameter selected for the interrupting bores.

3. The method, as defined in claim 1 or 2, characterized by the fact that two or a plurality of units on planar members C and D are first provided with connecting bores determined in accordance with the circuit diagram for the respective unit;

that subsequently the units are formed into one unit with the use of an intermediate layer of suitable insulating material, in which unit, the insertion positions are disposed coincidentally one on top of the other; and that finally the insertion bores required based on the circuit diagram are prepared in the respective insertion positions and the walls of said bores are metallized, with defined insertion bores serving the purpose of receiving component connections and/or connecting trains of conductors in different units.

4. The method, as defined in claim 1, characterized by the fact that two of the conductor train planar members C and D are in each case arranged on the two surfaces of the material forming a layer.

5. The method, as defined in claim 4, characterized by the fact that insulation bores are provided in the positions not serving, based on the circuit diagram, for connecting defined units or for connecting components.

6. The method, as defined in claim 5, characterized by the fact that in the production of a circuit board consisting of a plurality of units, the insulation bores are wholly or partially filled with insulating material.

7. The method, as defined in claim 6, characterized by the fact that the insulation bores are filled with insulating material by filling said bores with resin in the course of the molding operation.

8. The method, as defined in claim 6, characterized by the fact that the walls of the bore holes are metallized.

9. The method, as defined in claim 6, characterized by the fact that the unit composed of planar members A, B, C and D or the circuit board prepared from a plurality of such units is provided in the course of its preparation or thereafter with an insulating layer such as, for example, a prepreg, and that additional patterns of conductor trains are applied to the surface or surfaces of the insulating layer, said patterns being connected, if present, with the conductor trains of the units by connecting bores in accordance with the circuit diagram.

10. The method, as defined in any one of claims 1, 2, 4, 5, 6, 7, 8 or 9 characterized by the fact that the units are produced by press-molding and under the action of heat and that a plurality of units are pre-molded to form a circuit board, if need be, with the intermediate arrangement of suitable layers of insulating material such as prepregs.

* * * * *